United States Patent
Tsai et al.

(10) Patent No.: US 6,309,964 B1
(45) Date of Patent: Oct. 30, 2001

(54) METHOD FOR FORMING A COPPER DAMASCENE STRUCTURE OVER TUNGSTEN PLUGS WITH IMPROVED ADHESION, OXIDATION RESISTANCE, AND DIFFUSION BARRIER PROPERTIES USING NITRIDATION OF THE TUNGSTEN PLUG

(75) Inventors: Ming Hsing Tsai, Taipei; Shaulin Shue, Hsinchu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/349,845

(22) Filed: Jul. 8, 1999

(51) Int. Cl.[7] ............................................. H01L 21/4763
(52) U.S. Cl. ..................... 438/648; 438/627; 438/633; 438/637; 438/643; 438/687; 438/685
(58) Field of Search ................................ 438/648, 622, 438/624, 627–629, 633, 637–640, 643–645, 685, 687, 672, 675

(56) References Cited

U.S. PATENT DOCUMENTS

| | | | |
|---|---|---|---|
| 5,084,412 | 1/1992 | Nakasaki | 437/189 |
| 5,314,843 | 5/1994 | Yu et al. | 437/225 |
| 5,633,200 | * 5/1997 | Hu | 438/653 |
| 5,691,235 | 11/1997 | Meikle et al. | 437/190 |
| 5,744,376 | 4/1998 | Chan et al. | 437/190 |
| 5,780,908 | * 7/1998 | Sekiguchi et al. | 257/383 |
| 5,891,513 | * 4/1999 | Dubin et al. | 438/633 |
| 5,981,377 | * 11/1999 | Koyama | 438/653 |
| 6,037,664 | * 3/2000 | Zhao et al. | 257/758 |
| 6,110,648 | * 8/2000 | Jang | 430/312 |

* cited by examiner

Primary Examiner—Charles Bowers
Assistant Examiner—Thanh Nguyen
(74) Attorney, Agent, or Firm—George O. Saile; Stephen B. Ackerman; William J. Stoffel

(57) ABSTRACT

A method for forming a damascene structure over tungsten plugs using nitridation of said tungsten plugs to provide better oxidation resistance, better adhesion properties and better copper diffusion barrier proerties. The process begins by providing a substrate structure having at least one device layer thereon and having a first dielectric layer overlying the device layer. The dielectric layer has tungsten plugs therein providing a conductive path between the surface of the dielectric layer and the device layer. The tungsten plugs are nitriduzed to form a $WN_x$ layer on top of the tungsten plugs. A second dielectric layer is deposited over the WNx layer and the first dielectric layer. The second dielectric layer is patterned to form a trench in the second dielectric layer; whereby the $WN_x$ layer is exposed in the trench. A barrier layer is formed in the trench. A metal layer is formed over the barrier layer. The metal layer and the second dielectric layer are planarized to form a damascene structure.

18 Claims, 3 Drawing Sheets

US 6,309,964 B1

METHOD FOR FORMING A COPPER DAMASCENE STRUCTURE OVER TUNGSTEN PLUGS WITH IMPROVED ADHESION, OXIDATION RESISTANCE, AND DIFFUSION BARRIER PROPERTIES USING NITRIDATION OF THE TUNGSTEN PLUG

BACKGROUND OF INVENTION

1) Field of the Invention

This invention relates generally to fabrication of semiconductor devices and more particularly to a method for forming a copper damascene structure over a tungsten plug with improved adhesion, oxidation resistance and diffusion barrier properties by using nitridation of the tungsten plug.

2) Description of the Prior Art

The term Damascene is derived from a form of inlaid metal jewelery first seen in the city of Damascus. In the context of integrated circuits it implies a patterned layer imbedded on and in another layer such that the top surfaces of the two layers are coplanar.

As device dimensions shrink, the electrical conductivity of the conductive materials used for interconnections (or wiring) becomes increasingly important. Because of its excellent conductivity, copper has become the most attractive interconnect material. Damascene processes have become a common method of forming a copper line contacting underlying tungsten plugs (W-plugs).

However, the top surface of the W-plugs can be oxidized during an etching process to form a trench for a damascene structure, or even from exposure to air. Another problem with current damascene processes is that the oxidized tungsten or tungsten at the top of the W-plugs provide poor adhesion to other materials such as a TaN barrier layer. Also, the tungsten provides a poor diffusion barrier to copper from the damascene structure, allowing the xopper to diffuse into the W-plugs.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,744,376 (Chan et al.) teaches a Copper plug with a barrier layer.

U.S. Pat. No. 5,314,843 (Yu et al.) shows a $WN_x$ layer on a W layer before a CMP where the WNx layer is used as a CMP-resist layer.

U.S. Pat. No. 5,084,412 (Nakasaki) shows a W-plug covered by a chromium layer and a copper line. The copper line is covered with a nitride metal.

U.S. Pat. No. 5,691,235 (Meikle et al.) shows a method of depositing W-nitride.

SUMMARY OF THE INVENTION

It is an object of the present invention to provide a method for forming a damascene structure over W-plugs using nitridation of the W-plugs to provide better oxidation resistance, thereby reducing the interconnect resistance.

It is another object of the present invention to provide a method for forming a damascene structure over W-plugs using nitridation of the W-plugs to provide better adhesion between the W-plugs and the overlying material.

It is yet another object of the present invention to provide a method for forming a damascene structure over W-plugs using nitridation of the W-plugs to provide a better diffusion barrier between the W-plugs and the overlying material, thereby preventing copper from the damascene structure from diffusing into the W-plugs.

To accomplish the above objectives, the present invention provides a method for forming a damascene structure over tungsten plugs using nitridation of said tungsten plugs to provide better oxidation resistance, better adhesion properties and better copper diffusion barrier proerties. The process begins by providing a substrate structure having at least one device layer thereon and having a first dielectric layer overlying the device layer. The dielectric layer has tungsten plugs therein providing a conductive path between the surface of the dielectric layer and the device layer. The tungsten plugs are nitridized to form a $WN_x$ layer on top of the tungsten plugs. A second dielectric layer is deposited over the WNx layer and the first dielectric layer. The second dielectric layer is patterned to form a trench in the second dielectric layer; whereby the $WN_x$ layer is exposed in the trench. A barrier layer is formed in the trench. A metal layer is formed over the barrier layer. The metal layer and the second dielectric layer are planarized to form a damascene structure.

The present invention provides considerable improvement over the prior art. The $WN_x$ layer (40) on top of the tungsten plugs (30) is more resistant to oxidation by the oxygen plasma than the tungsten plugs which are exposed in the current process. Another advantage is that the $WN_x$ layer (40) provide better adhesion for the barrier layer (60) than the tungsten plugs (30) without a $WN_x$ layer (40), particularly if the tungsten plugs are oxidized. Yet another advantage of the present invention is that the $WN_x$ layer (40) provides an improved diffusion barrier to copper migration, preventing copper migration into the tungsten plugs.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming a copper damascene structure over tungsten plugs using nitridation of said tungsten plugs to provide improved oxidation resistance of the tungsten plugs, improved adhesion between the tungsten plugs and the damascene structure, and an improved barrier to the copper in damascene structure diffusing into the tungsten plugs.

Figure 1:
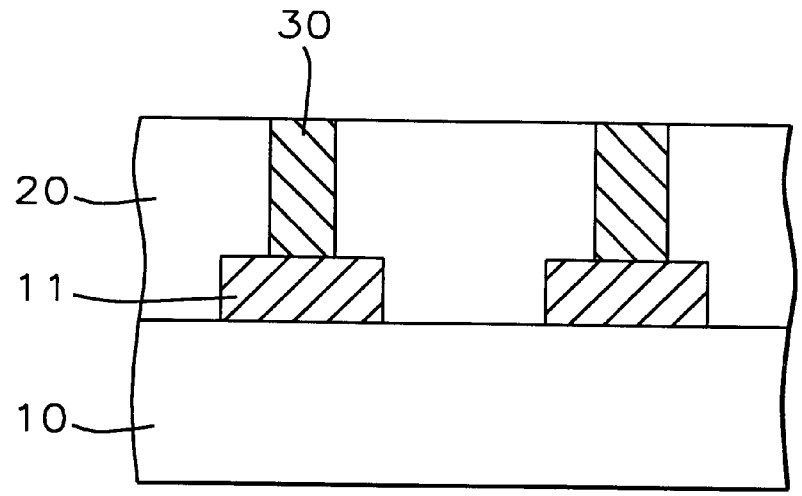
FIGS. 1, 2, 3, 4, 5 & 6 illustrate sequential sectional views of a process for according to the invention.

Referring to FIG. 1, the process begins by providing a substrate structure (10), having at least one device layer (11)

thereon. The device layer (11) has a first dielectric layer (20) thereover, having tungsten plugs (30) therein which provide a conductive path between the surface of the dielectric layer (20) and the device layer (11).

Figure 2:
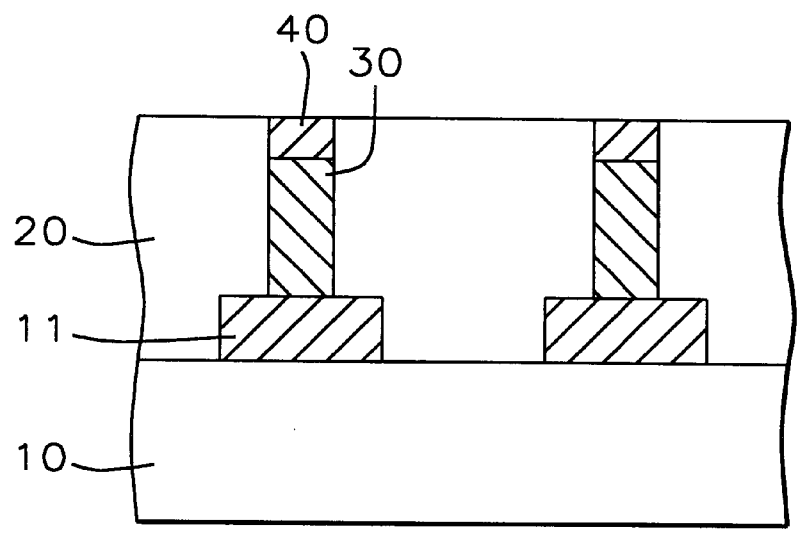

Referring to FIG. 2, the tungsten plugs (30) are nitridized to form a $WN_x$ layer (40) at the top of the tungsten plugs (30). The $WN_x$ layer (40) is preferably formed to a thickness of between about 20 Angstroms and 600 Angstroms. The tungsten plugs can be nitridzed using one of several methods, includeing an $N_2$ plasma, an $NH_3$ plasma, or an anneal in an $N_2$ or an $NH_3$ atmosphere. For a nitridation using an $N_2$ plasma, nitridation is performed at a pressure of between about 1 mTorr and 500 mTorr using an RF power of between about 50 Watts and 5000 Watts. For a nitridation using an $NH_3$ plasma, nitridation is performed at a pressure of between about 5 mTorr and 500 mTorr using an RF power of between about 50 Watts and 5000 Watts. For an anneal in a $N_2$ atmosphere, the anneal is performed at a temperature between about 600° C. and 800° C. for a time of between about 10 seconds and 240 seconds. For an anneal in a $NH_3$ atmosphere, the anneal is performed at a temperature between about 600° C. and 800° C. for a time of between about 10 seconds and 240 seconds.

Figure 3:
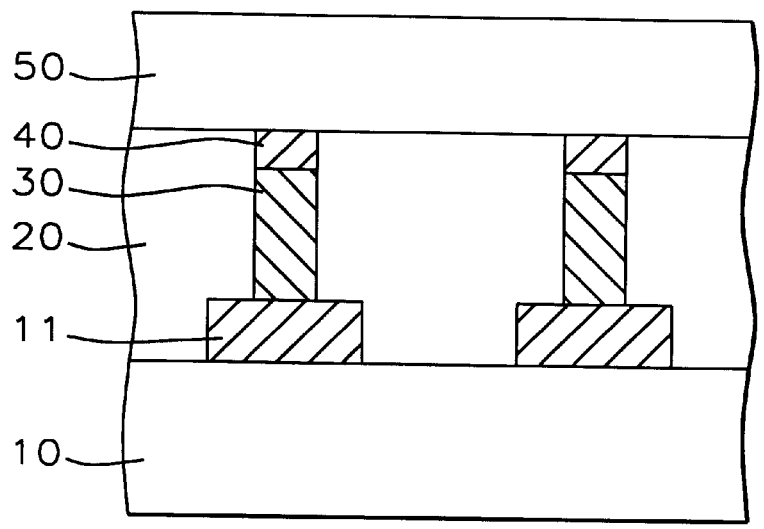

Referring to FIG. 3, a second dielectric layer (50) is formed over the WNx layer (40) and the first dielectric layer (20). The second dielectric layer is preferably composed of silicon dioxide formed to a thickness of between about 1000 Angstroms and 10,000 Angstroms. The second dielectric layer (50) can be formed using CVD or PECVD.

Figure 4:
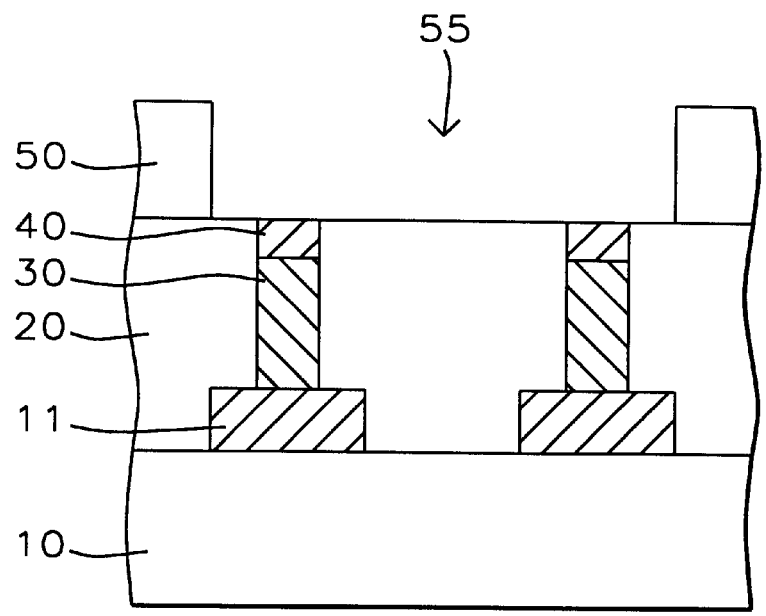

Referring to FIG. 4, the second dielectric layer (50) is patterned using photolithography and etching to form a trench (55) in the second dielectric layer (50). The trench (55) is formed such that the $WN_x$ layer (40) is exposed in the trench (55). The etch is preferably performed using an oxygen plasma.

A key advantage of the present invention is that the $WN_x$ layer (40) on top of the tungsten plugs (30) is more resistant to oxidation by the oxygen plasma than the tungsten plugs which are exposed in the current process.

Figure 5:
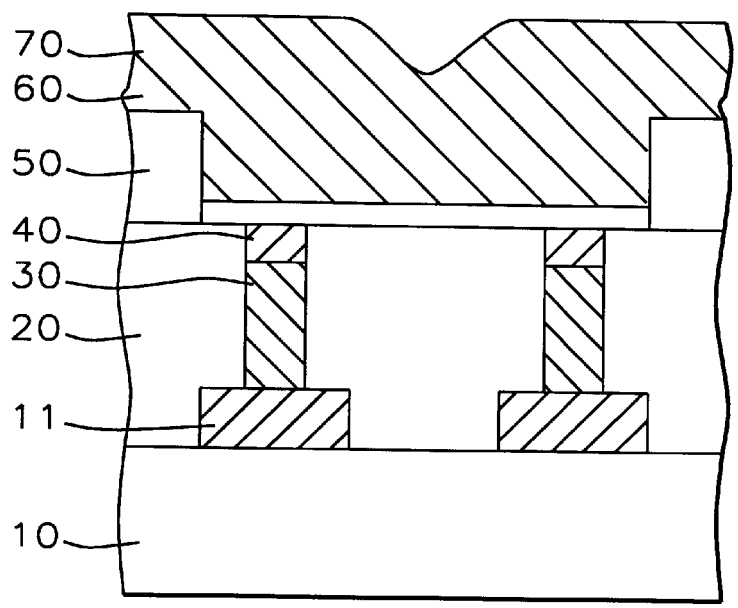

Referring to FIG. 5, a barrier layer (60) is formed in the trench (55). The barrier layer (60) is preferably formed to a thickness of between about 10 Angstroms and 500 Angstroms using sputtering, plating, or most preferably chemical vapor deposition. The barrier layer (60) can be composed of Ti, W, or most preferably TaN.

Another key advantage of the present invention is that the $WN_x$ layer (40) provide better adhesion for the barrier layer (60) than the tungsten plugs (30) without a $WN_x$ layer (40), particularly if the tungsten plugs are oxidized.

Referring again to FIG. 5, a metal layer (70) is formed over the barrier layer (60). The metal layer (70) is preferably composed of copper and has a sufficient thickness so that the top surface of the metal layer (70) is above the top surface of the adjacent second dielectric layer (50). For a copper metal layer (70), the copper can be deposited using a sputtering, a CVD, or most preferably a plating process.

Yet another key advantage of the present invention is that the $WN_x$ layer (40) provides an improved diffusion barrier to copper migration, preventing copper migration into the tungsten plugs.

Figure 6:
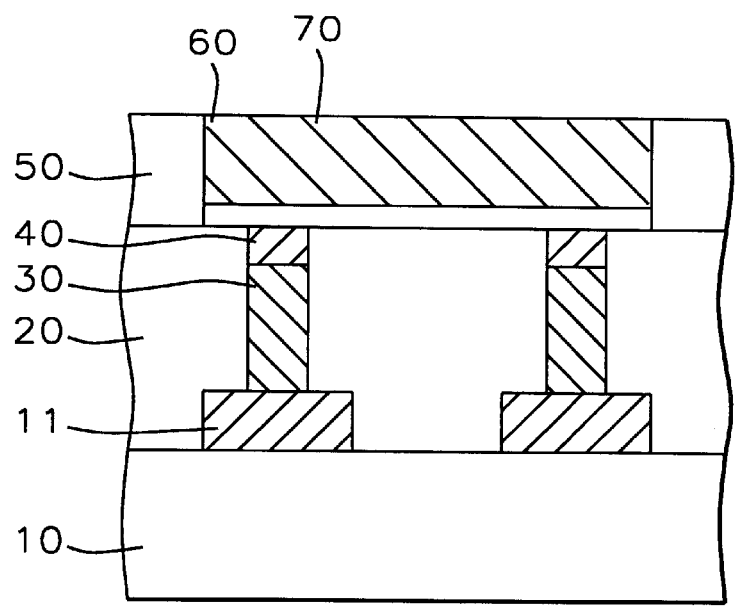

Referring to FIG. 6, the metal layer (70) and the second dielectric layer (50) are planarized to form a damascene structure. The metal layer (70) and the second dielectric layer (50) can be planarized using a chemical mechanical polishing process or and etch-back process as are known in the art.

While the invention has been particularly shown and described with reference to the preferred embodiments thereof, it will be understood by those skilled in the art that various changes in form and details may be made without departing from the spirit and scope of the invention.

What is claimed is:

1. A method for forming a damascene structure over tungsten plugs using nitridation of said tungsten plugs, comprising the steps of:
   a. providing a substrate structure, having at least one device layer thereon; said device layer having a first dielectric layer thereover; said dielectric layer having tungsten plugs therein providing a conductive path between the surface of said dielectric layer and said device layer;
   b. nitridizing said tungsten plugs to form a tungsten nitride ($WN_x$) layer on said tungsten plugs;
   c. depositing a second dielectric layer over said $WN_x$ layer and said first dielectric layer;
   d. patterning said second dielectric layer to form a trench in said second dielectric layer; whereby said $WN_x$ layer is exposed in said trench;
   e. forming a barrier layer in said trench;
   f. forming a metal layer over said barrier layer; and
   g. planarizing said metal layer and said second dielectric layer to form a damascene structure.

2. The method of claim 1 wherein said $WN_x$ layer is formed to a thickness of between about 20 Angstrons and 600 Angstroms using an $N_2$ plasma.

3. The method of claim 1 wherein said $WN_x$ layer is formed to a thickness of between about 20 Angstrons and 600 Angstroms using an $NH_3$ plasma.

4. The method of claim 1 wherein said $WN_x$ layer is formed to a thickness of between about 20 Angstroms and 600 Angstroms using a thermal anneal at a temperature between about 600° C. and 800° C. for a time of between about 10 seconds and 240 seconds in a $N_2$ atmosphere.

5. The method of claim 1 wherein said $WN_x$ layer is formed to a thickness of between about 20 Angstroms and 600 Angstroms using a thermal anneal at a temperature between about 600° C. and 800° C. for a time of between about 10 seconds and 240 seconds in a $NH_3$ atmosphere.

6. The method of claim 1 wherein said barrier layer is composed of TaN having a thickness of between about 10 Angstroms and 500 Angstroms.

7. The method of claim 1 wherein said second dielectric layer is composed of $SiO_2$ having a thickness of between about 1000 Angstroms and 10,000 Angstroms.

8. The method of claim 1 wherein said second dielectric layer is patterned using a flourine-based etch chemistry.

9. A method for forming a copper damascene structure over tungsten plugs using nitridation of said tungsten plugs to provide improved oxidation resistance of the tungsten plugs, improved adhesion between the tungsten plugs and the damascene structure, and an improved barrier to the copper in damascene structure diffusing into the tungsten plugs, comprising the steps of:
   a. providing a substrate structure, having at least one device layer thereon; said device layer having a first dielectric layer thereover; said dielectric layer having tungsten plugs therein providing a conductive path between the surface of said dielectric layer and said device layer;
   b. nitridizing said tungsten plugs to form a tungsten nitride ($WN_x$) layer on said tungsten plugs;
   c. depositing a second dielectric layer over said WNx layer and said first dielectric layer;

d. patterning said second dielectric layer to form a trench in said second dielectric layer; whereby said $WN_x$ layer is exposed in said trench;

e. forming a barrier layer in said trench;

f. depositing a copper metal layer over said barrier layer; and g. planarizing said copper metal layer and said second dielectric layer to form a damascene structure.

10. The method of claim 9 wherein said $WN_x$ layer is formed to a thickness of between about 20 Angstrons and 600 Angstroms using an $N_2$ plasma.

11. The method of claim 9 wherein said $WN_x$ layer is formed to a thickness of between about 20 Angstroms and 600 Angstroms using an $NH_3$ plasma.

12. The method of claim 9 wherein said WNx layer is formed to a thickness of between about 20 Angstroms and 600 Angstroms using a thermal anneal at a temperature between about 600° C. and 800° C. for a time of between about 10 seconds and 240 seconds in a $N_2$ atmosphere.

13. The method of claim 9 wherein said WNx layer is formed to a thickness of between about 20 Angstroms and 600 Angstroms using a thermal anneal at a temperature between about 600° C. and 800° C. for a time of between about 10 seconds and 240 seconds in a $NH_3$ atmosphere.

14. The method of claim 9 wherein said barrier layer is composed of TaN having a thickness of between about 10 Angstroms and 500 Angstroms.

15. The method of claim 9 wherein said barrier layer is composed of Ti having a thickness of between about 10 Angstroms and 500 Angstroms.

16. The method of claim 9 wherein said barrier layer is composed of W having a thickness of between about 10 Angstroms and 500 Angstroms.

17. The method of claim 9 wherein said second dielectric layer is composed of $SiO_2$ having a thickness of between about 1000 Angstroms and 10,000 Angstroms.

18. The method of claim 9 wherein said second dielectric layer is patterned using a florine-based etch chemistry.

* * * * *